(12) United States Patent
Piersimoni et al.

(10) Patent No.: US 7,028,135 B2
(45) Date of Patent: Apr. 11, 2006

(54) MULTIPLE PARTITION MEMORY COMMAND USER INTERFACE

(75) Inventors: Pietro Piersimoni, Via Ruggero Grieco (IT); Pasquale Pistilli, Via Paolo (IT); Elio D'Ambrosio, Via Ugo La Malfa (IT)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 10/229,924

(22) Filed: Aug. 28, 2002

(65) Prior Publication Data

US 2003/0062938 A1 Apr. 3, 2003

(30) Foreign Application Priority Data

Aug. 31, 2001 (IT) .......................... RM2001A0529

(51) Int. Cl.
*G06F 12/00* (2006.01)
(52) U.S. Cl. .............................. 711/103; 7/710; 7/262; 326/62
(58) Field of Classification Search ................ 711/703, 711/105, 5, 103; 710/262; 326/62, 41, 101; 327/200, 202; 713/2
See application file for complete search history.

(56) References Cited

U.S. PATENT DOCUMENTS

| 5,729,683 | A | * | 3/1998 | Le et al. ........................ 713/2 |
| 5,742,787 | A | * | 4/1998 | Talreja ........................ 711/103 |
| 6,001,011 | A | * | 12/1999 | Johnson ........................ 452/65 |
| 6,279,069 | B1 | | 8/2001 | Robinson et al. |
| 6,643,725 | B1 | * | 11/2003 | Kozakai et al. ............. 710/300 |
| 6,757,872 | B1 | * | 6/2004 | Pistilli et al. .................. 716/1 |

FOREIGN PATENT DOCUMENTS

| EP | 1130510 A2 | * | 9/2001 |
| EP | 1195944 A2 | * | 4/2002 |
| JP | 11086580 A | * | 3/1999 |

* cited by examiner

*Primary Examiner*—Pierre-Michel Bataille
(74) *Attorney, Agent, or Firm*—Leffert Jay & Polglaze, P.A.

(57) ABSTRACT

A multiple partition memory array has a command user interface for each partition, and a logic interface. The logic interface receives signals from each of the command user interfaces to restrict executable commands in the command user interfaces to those commands that will not tax the system given the current status of each of the command user interfaces.

23 Claims, 3 Drawing Sheets

MULTIPLE PARTITION MEMORY COMMAND USER INTERFACE

RELATED APPLICATIONS

This application claims priority to Italian Patent Application Serial No. RM2001A000529, filed Aug. 31, 2001, entitled "Multiple Partition Memory Command User Interface."

The present invention relates generally to memory circuits, and more specifically to multiple partition memory circuits.

BACKGROUND

In a Flash memory chip, the user sends commands to the Flash to operate the memory using the data lines DQs. The commands are interpreted and routed for execution to the remaining chip by a block of logic called a command user interface (CUI). The CUI is a commands interpreter that accepts commands from the user. Such commands may include by way of example only and not by way of limitation "read array," "read configuration register," "program," "erase," "suspend," and the like. The CUI also controls the execution of the received commands. The commands are entered using multiple cycle clock operation.

In Flash memory chips in which the memory cells are organized into a single array, the CUI controls all of the operations that can be executed on the single memory partition. Recently, later generation Flash memories include cell arrays organized into two partitions, on which concurrent operations can be executed. In these memories, one operation may be in execution in one partition, while the other partition executes a different operation. Due to the two partition architecture, time consuming operations, such as erase, are capable of execution in one partition while at the same time, data can be retrieved from the other partition not involved in the erase operation.

CUIs are typically implemented using synthesized logic. When a Flash architecture with two partitions requires concurrent operations, the CUI increases dramatically in size to accommodate the increased number of commands needed to operate both partitions. A typical CUI for a two partition array includes a word line decoder, a read only memory (ROM), and latches. Because the two partitions must be managed independently for concurrent operations, the number of inputs and outputs of the CUI, and hence the size of the ROM and the associated ROM circuitry, increases accordingly. The silicon area occupied by the CUI becomes too large, an in turn increases the overall cost of the chip. The size increase is further emphasized for chips using more than two partitions, in which the number of inputs, outputs, and the complexity of associated circuitry, all continue to increase.

It would be desirable to provide a smaller CUI architecture to manage concurrent operations in a memory having two or more partitions.

SUMMARY

In one embodiment, a circuit includes a first command user interface and a second command user interface. Each command user interface has a word line decoder to receive command signals and signals indicative of internal status and status of the other command user interface, a read only memory to decode the command signals, and a status logic block. A logic interface is connected between the command user interfaces, to receive status signals from each command user interface and to accept or reject a received command based on the status signals.

In another embodiment, a circuit includes a first command user interface having a word line decoder to receive commands and feedback signals, and a read only memory to store command interpretations, and a status block to determine current status of the command user interface, a second command user interface having a word line decoder to receive commands and feedback signals, and a read only memory to store command interpretations, and a status block to determine current status of the command user interface, and a logic interface operatively connected to receive status signals from each of the status blocks, and to generate status signals to each command user interface representative of the status of the other command user interface.

In yet another embodiment, a memory device includes an array of memory cells divided into first and second partitions, row and column address circuitry to decode received row and column addresses, input/output circuitry to receive external data and to pass the data to the array, and a circuit to receive commands and to control the commands to prevent overtaxing the array.

In still another embodiment, a method includes receiving an external command at a control circuit, decoding the command address, sending the command to one of a number of command user interfaces, where each command user interface operates to control a partition of a memory array, and determining whether to accept or to reject the command based on the status of each of the command user interfaces.

In yet another embodiment, a method of operating a memory circuit includes receiving a command signal, decoding an address of the command signal, sending the command signal to one of a number of command user interfaces corresponding to the decoded address, and determining whether to execute or to reject the command based on the status of each of the command user interfaces.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figure 1:
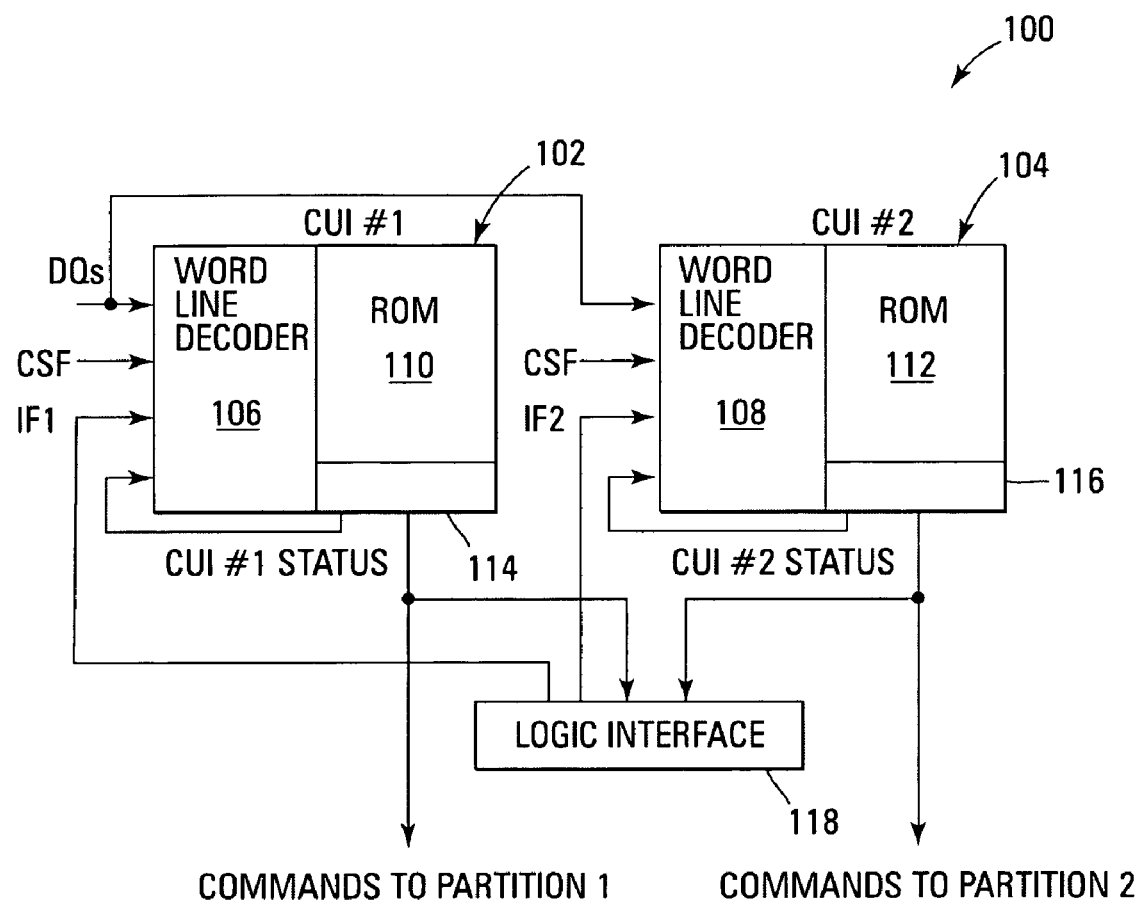
FIG. 1 is a block diagram of a circuit according to one embodiment of the present invention.

Referring to FIG. 1, a block diagram of a CUI architecture 100 according to one embodiment of the present invention is shown. CUI architecture 100 comprises first and second CUIs 102 and 104. Each CUI 102 and 104 has its own word line decoder 106 and 108, its own ROM 110 and 112, and status generating block 114 and 116.

The status generating blocks 114 and 116 each generate signals representative of the status of their respective CUIs.

The status signals are presented to their respective CUI word line decoders, and also to logic interface 118. Logic interface 118 compares the status signals from the two CUIs 102 and 104, and outputs feedback signals to each CUI indicative of the status of the other CUI.

For example, a Flash memory includes a memory array divided into two separate partitions, with each partition being controlled by its own CUI. The selection of the partition and associated CUI on which to operate is executed by decoding a received address to the memory array. Each of the partitions covers a portion of the range of addresses available to be received by the memory array. Therefore, execution of a given operation proceeds as follows. The memory receives a sent command code corresponding to an operation desired to be performed in the memory array. This command comes into the memory through the DQ lines. Using the memory address, the memory partition on which the command is to be operated is selected. The CUI corresponding to the selected partition is activated, and decodes and executes the user command, subject to acceptable other commands being run on the other partition. Certain commands are not allowed to be run simultaneously on each partition, as they typically consume too many system or memory resources to allow proper operation of the commands on multiple partitions at one time.

The command interpretation and execution inside each CUI depends upon the status of various inputs to that CUI. Inputs to each CUI that control the operational parameters of the CUI include the present state of the selected CUI, the present state of the memory partition controlled by the selected CUI, the present state of the other partition, and the present state of the other CUI. These inputs are generated in one embodiment as follows. The present state of each CUI is fed back into its word line decoder from the status generating logic. The present state of the memory partition and the present state of the other partition are determined through the use of chip status feedback (CSF) signals indicating the condition of each of the chips. The present state of the other CUI is determined by evaluating signals generated by the logic interface 118, which receives its inputs from each of the CUIs and combines them in a predetermined logic circuit to generate output signals indicative of CUI status.

The concurrent management of the two CUIs is made possible by a communication protocol that allows the CUIs to exchange information and therefore to decide whether a given command is to be executed or rejected within the specific CUI. For example, in Flash memories, the program and erase operations each take a long time to complete once started. The program and erase operations also are very demanding in terms of power consumption. Even if the architecture of the memory array can allow for concurrent program or erase operations in different memory partitions, due to power and other requirements, this operating mode is forbidden as being too taxing on the system. By means of the signals generated by logic interface 118, the current demands and current operating status of each CUI is made available to the other CUI and to the logic interface. Certain operations cannot be mutually concurrently performed on each CUI. If CUI 102 is performing a restricted operation, the logic interface blocks CUI 104 from performing that operation or any other operation that is too taxing on the overall system 100 until such time as the restricted operation is completed in CUI 102.

For a memory partitioned in two banks, two CUIs are used. Each CUI is identical to the other CUI. Each CUI is used for one bank or partition. Each CUI is dedicated solely to its partition. The two CUIs operate in a handshaking protocol, in which each CUI has the knowledge of the status of the other through the use of feedback signals. The two CUIs continuously exchange information using a specific communication protocol. With two CUIs, the overall size of the CUI function for the apparatus is reduced, even if the single combined CUI is optimized.

Each CUI is based on a ROM that decodes user commands, A handshaking protocol between the CUIs based on the feedback signals from the logic interface is programmable at the word line decoder for each CUI. This allows for flexibility in modification of the commands and for fast debugging when manufacturing a chip.

When a command comes into the system 100, the address is decoded. The selection of the partition, in this case partition 102 or partition 104, is dependent upon the address, with each partition having its own specific range in the available addresses. When the partition is selected, the CUI corresponding to the selected partition is activated to decode and execute the received command. Command interpretation and execution within the system 100 depends upon a number of factors. These factors include the present state of the selected CUI, the present state of the memory partition controlled by the selected CUI, the present state of the other partition, and the present state of the other CUI.

Figure 2:
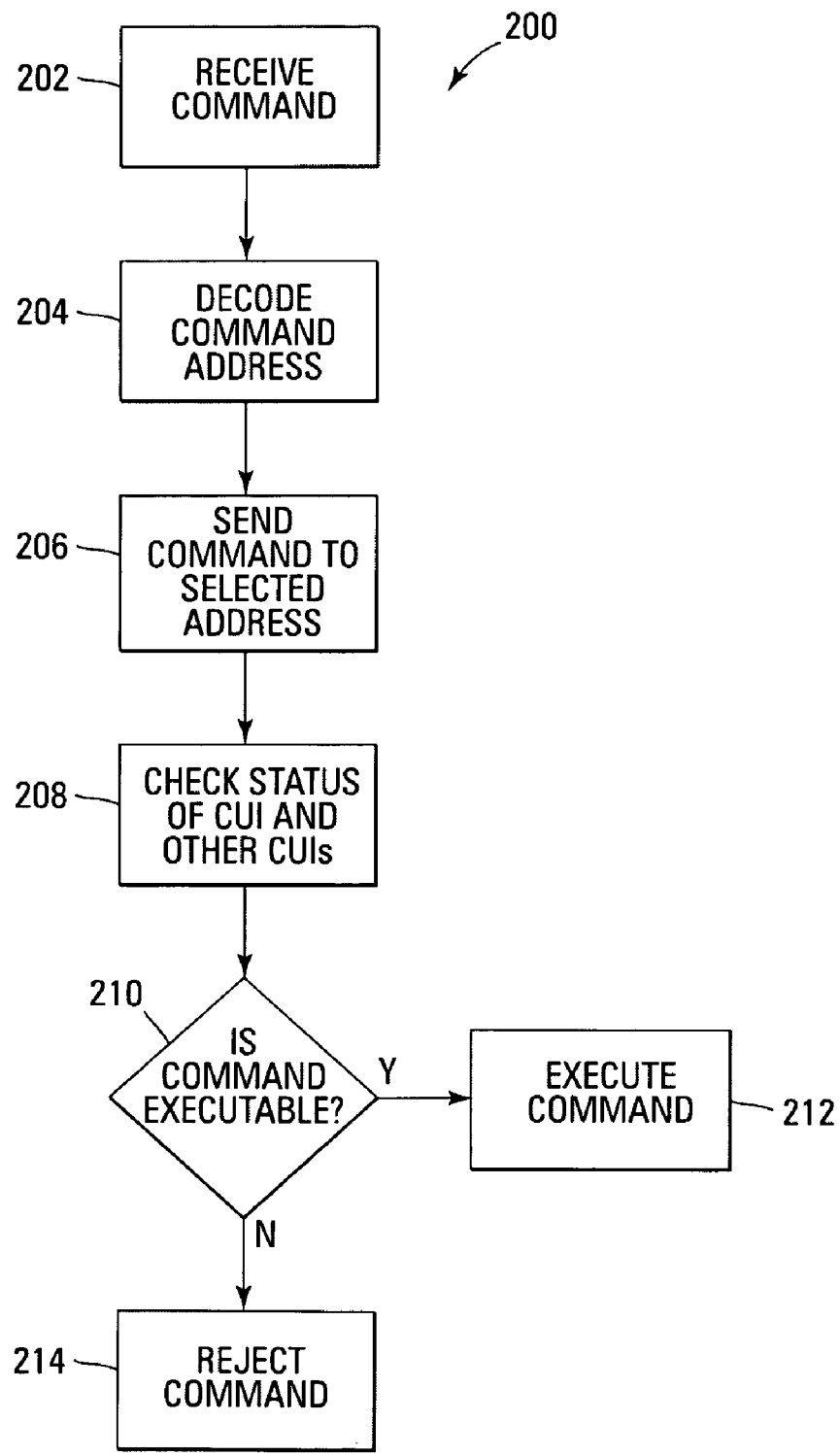
FIG. 2 is a flow chart diagram of a method according to another embodiment of the present invention.

In operation, the system works as follows. A flow chart diagram of a method of operation 200 for a system such as the system 100 is shown in FIG. 2. A command is received in block 202. In block 204, the address of the command is decoded, and the command is sent to the selected address in block 206. At this point, the CUI system such as system 100 receives the command at the CUI for the partition to which the command is addressed. The CUI to which the command is addressed checks each of: its own current status through the use of the signals received from itself (CUI status signals), the present state of the memory partition controlled by the selected CUI (through CSF signals), and the present state of the other CUI (through logic interface feedback signals), in block 208. If the received command is executable, as determined in decision block 210, that is there are no restrictions based on the current states of each CUI and the memory partition on which the operation is to be performed, the command is executed in block 212. If the received command is not executable because of restrictions in the current state of either CUI or the selected memory partition, the command is held or not executed in block 214.

Figure 3:
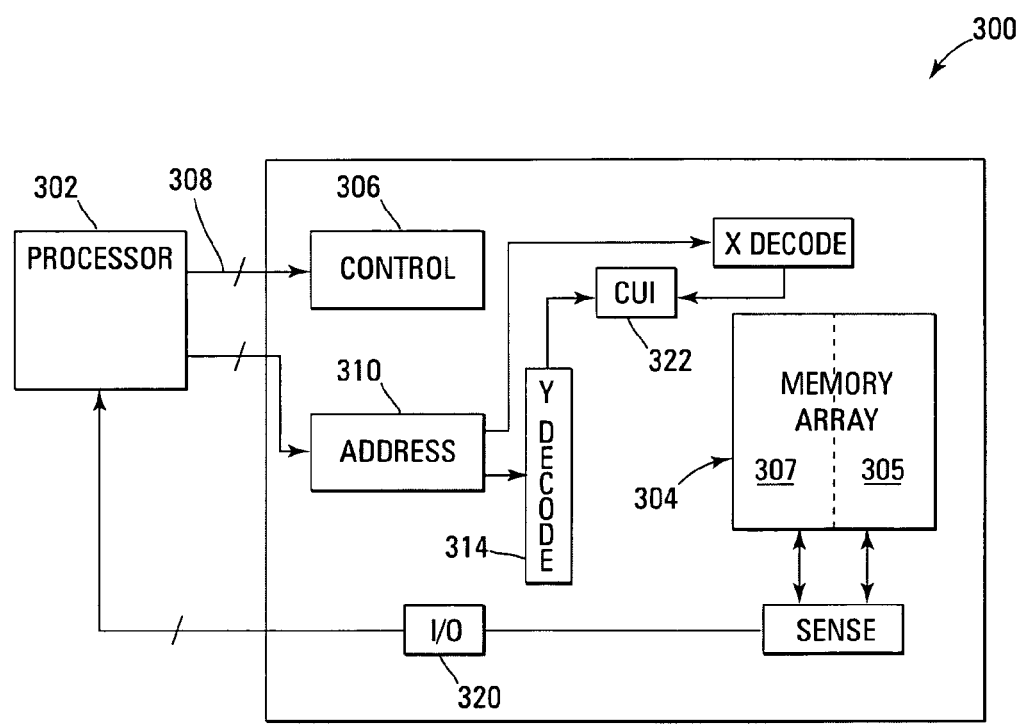
FIG. 3 is a simplified block diagram of a memory device according to another embodiment of the present invention.

Referring to FIG. 3, a simplified block diagram of a memory device 300 of the present invention is described. The memory device can be coupled to a processor 302 for bi-directional data communication. The memory includes an array of memory cells 304 having two partitions 305 and 307. Control circuitry 306 is provided to manage data storage and retrieval from the array in response to control signals 308 from the processor. Address circuitry 310, X-decoder 312 and Y-decoder 314 analyze address signals 316 and storage access locations of the array. Sense circuitry 318 is used to read data from the array and couple output data to I/O circuitry 320. The I/O circuitry operates in a bi-directional manner to receive data from processor 302 and pass this data to array 304. A CUI circuit 322 such as circuit 100 is interposed between decoders 612 and 614 and the array 304. The CUI 322 receives signals from the array partitions as described above, and sends commands to the partitions according to the logic interface.

The embodiments of the present invention reduce the overall size of the CUI blocks in a multiple partition system. In previous CUI architectures, a combined CUI for the multiple partitions requires more logic and therefore more real estate. The individual CUIs are identical in their construction, and are therefore scalable to any number of partitions in a memory.

In another embodiment, a programmable decoder and ROM architecture is used with the CUI embodiments of the present invention. Such a programmable decoder and ROM architecture is described more fully in commonly assigned patent application entitled COMMAND USER INTERFACE WITH PROGRAMMABLE DECODER. In this embodiment, each CUI ROM uses a programmable decoder and ROM architecture. Such an embodiment allows for CUI program changes to be made at nearly the last phase of the manufacturing process to accommodate design changes without requiring a full reprogramming and reconstruction of the CUI from a blank wafer.

It should be understood that the methods and apparatuses described herein, while described with two CUIs, are scalable to multiple CUIs. The logic interface that controls the CUIs will be different for multiple CUIs, but the methods remain the same. If a restricted command is operating on the system, another restricted command is not run unless the system logic determines that it will not tax the system improperly.

It should be further understood that the embodiments of the invention are applicable to different types of memories, including by way of example only and not by way of limitation, DRAM, SDRAM, flash, and the like. Whenever a command user interface is used to interpret commands, and multiple partitions are used, the embodiments of the present invention are applicable.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit, comprising:
   a first command user interface and a second command user interface, each command user interface comprising:
      a word line decoder to receive command signals and signals indicative of internal status and status of the other command user interface, a read only memory to decode the command signals, and a status logic block; and
      a logic interface to receive status signals from each command user interface and to accept or reject a received command based on the status signals, and to communicate to each command user interface the status of each other command user interface.

2. The circuit of claim 1, wherein the internal feedback signals comprise status signals from the CUI status logic block and feedback signals from the logic interface, the signals indicative of CUI status for the specific CUI and the other CUI respectively.

3. A circuit, comprising:
   a first command user interface having a word line decoder to receive commands and feedback signals, and a read only memory to store command interpretations, and a status block to determine current status of the command user interface;
   a second command user interface having a word line decoder to receive commands and feedback signals, and a read only memory to store command interpretations, and a status block to determine current status of the command user interface; and
   a logic interface operatively connected to receive status signals from each of the status blocks, and to generate status signals to each command user interface representative of the status of the other command user interface.

4. The circuit of claim 3, wherein the logic interface executes a handshaking protocol between the first and the second command user interfaces, and restricts executable commands to a non-restricted command list.

5. The circuit of claim 3, wherein the logic interface comprises logic to reject a command when one of a set of restricted commands is desired to be executed.

6. The circuit of claim 5, wherein the set of restricted commands comprises program commands and erase commands.

7. A memory device comprising:
   an array of memory cells divided into first and second partitions;
   row and column address circuitry to decode received row and column addresses;
   input/output circuitry to receive external data and to pass the data to the array; and
   a circuit to receive commands and to control the commands to prevent overtaxing the array, wherein the circuit comprises:
   a first command user interface having a word line decoder to receive commands and feedback signals, and a read only memory to store command interpretations, and a status block to determine current status of the command user interface;
   a second command user interface having a word line decoder to receive commands and feedback signals, and a read only memory to store command interpretations, and a status block to determine current status of the command user interface; and
   a logic interface operatively connected to receive status signals from each of the status blocks, and to generate status signals to each command user interface representative of the status of the other command user interface.

8. A processing system, comprising:
   a memory controller; and
   a memory array coupled to the memory controller and comprising:
   an array of memory cells divided into first and second partitions;
   row and column address circuitry to decode received row and column addresses;
   input/output circuitry to receive external data and to pass the data to the array; and
   a circuit to receive commands and to control the commands to prevent overtaxing the array, wherein the circuit comprises:
   a first command user interface having a word line decoder to receive commands and feedback signals, and a read only memory to store command interpretations, and a status block to determine current status of the command user interface;
   a second command user interface having a word line decoder to receive commands and feedback signals, and a read only memory to store command interpretations, and a status block to determine current status of the command user interface; and
   a logic interface operatively connected to receive status signals from each of the status blocks, and to generate status signals to each command user interface representative of the status of the other command user interface.

9. The circuit of claim 8, wherein the logic interface executes a handshaking protocol between the first and the second command user interfaces, and restricts executable commands to a non-restricted command list.

10. The circuit of claim 8, wherein the logic interface comprises logic to reject a command when one of a set of restricted commands is desired to be executed.

11. A method, comprising:
receiving an external command at a control circuit;
decoding the command address;
sending the command to an appropriate one of a plurality of command user interfaces, each command user interface operable to control a partition of a memory array; and
determining whether to accept or to reject the command based on the status of each of the plurality of command user interfaces, wherein determining further comprises communicating to each of the plurality of command user interfaces the status of each other command user interface.

12. The method of claim 11, wherein determining comprises:
evaluating a current status of each of the plurality of command user interfaces; and
accepting the command if no restricted commands are currently running on any of the plurality of command user interfaces.

13. The method of claim 11, wherein restricted commands comprise program and erase commands.

14. The method of claim 11, and further comprising:
self-checking the current status of the command user interface to which the command is addressed; and
rejecting the command if a restricted command is being run on the command user interface to which the command is addressed.

15. A method of operating a memory circuit, comprising:
receiving a command signal;
decoding an address of the command signal;
sending the command signal to one of a plurality of command user interfaces corresponding to the decoded address; and
determining whether to execute or to reject the command based on the status of each of the command user interfaces, wherein determining further comprises communicating to each of the plurality of command user interfaces the status of each other command user interface.

16. The method of claim 15, wherein determining comprises:
checking the status of each of the command user interfaces for current execution of one of a predetermined set of restricted commands; and
rejecting the received command signal if one of the predetermined set of restricted commands is being run on one of plurality of memory partitions operatively connected to a respective command user interface.

17. The method of claim 16, wherein restricted commands comprise program and erase commands.

18. The method of claim 15, wherein determining comprises:
sending current status signals for each of the command user interfaces to a logic interface;
resolving the current status of each of the command user interfaces; and
providing feedback signals for other command user interfaces to the command user interface to which the command is addressed.

19. A method of executing a command to a multiple partition memory, comprising:
decoding an address for the command;
sending the command to a command user interface for the partition to which the command is addressed; and
determining whether the command is executable on the partition to which the command is addressed based on the current status of each command user interface in the multiple partition memory, wherein determining further comprises communicating to each command user interface in the multiple partition memory the status of each other command user interface.

20. The method of claim 19, wherein determining comprises:
receiving in the logic interface signals indicative of the operational status of each of the command user interfaces for current execution of one of a predetermined set of restricted commands; and
rejecting the received command signal if one of the predetermined set of restricted commands is being run on one of plurality of memory partitions operatively connected to a respective command user interface.

21. The method of claim 19, wherein the predetermined set of restricted commands comprises commands that exceed a predetermined amount of time to execute.

22. The method of claim 19, wherein the predetermined set of restricted commands comprises commands that exceed a predetermined amount of power to execute.

23. The method of claim 19, wherein determining comprises:
sending current status signals for each of the command user interfaces to a logic interface;
resolving the current status of each of the command user interfaces; and
providing feedback signals for other command user interfaces to the command user interface to which the command is addressed.

* * * * *